United States Patent
Herber et al.

(10) Patent No.: US 9,036,349 B2
(45) Date of Patent: May 19, 2015

(54) COOLING DEVICE

(75) Inventors: Roland Herber, Saarbrücken (DE); Claudia Wetzstein, Kirkel (DE)

(73) Assignee: Hydac Cooling GmbH, Sulzbach/Saar (DE)

( * ) Notice: Subject to any disclaimer, the term of this patent is extended or adjusted under 35 U.S.C. 154(b) by 212 days.

(21) Appl. No.: 13/261,258

(22) PCT Filed: Oct. 12, 2010

(86) PCT No.: PCT/EP2010/006230
§ 371 (c)(1),
(2), (4) Date: Apr. 11, 2012

(87) PCT Pub. No.: WO2011/066883
PCT Pub. Date: Jun. 9, 2011

(65) Prior Publication Data
US 2012/0206879 A1    Aug. 16, 2012

(30) Foreign Application Priority Data
Dec. 1, 2009   (DE) .................. 10 2009 056 483

(51) Int. Cl.
*H05K 7/20*   (2006.01)

(52) U.S. Cl.
CPC ........ *H05K 7/20272* (2013.01); *H05K 7/20281* (2013.01); *H05K 7/20927* (2013.01); *H05K 2201/064* (2013.01)

(58) Field of Classification Search
USPC ......... 361/699, 704, 707, 709, 711, 717–720; 165/80.2–80.4
See application file for complete search history.

(56) References Cited

U.S. PATENT DOCUMENTS

| | | | |
|---|---|---|---|
| 3,718,850 A * | 2/1973 | Juri et al. | 363/144 |
| 4,117,525 A * | 9/1978 | Moore | 361/37 |
| 4,545,737 A * | 10/1985 | Stanton | 417/53 |
| 5,123,478 A * | 6/1992 | Hosaka | 165/292 |
| 5,271,239 A * | 12/1993 | Rockenfeller et al. | 62/259.2 |
| 5,522,452 A * | 6/1996 | Mizuno et al. | 165/286 |

(Continued)

FOREIGN PATENT DOCUMENTS

| | | |
|---|---|---|
| DE | 2135677 | 1/1972 |
| DE | 69603435 | 7/1999 |

(Continued)

*Primary Examiner* — Robert J Hoffberg
(74) *Attorney, Agent, or Firm* — Roylance, Abrams, Berdo and Goodman LLP

(57) ABSTRACT

A cooling device for an electric energy supply (2) has at least one first heat-dissipating part (3). The power components (4) of the first heat-dissipating part are connected to the cooling device (1) in a thermally conductive manner. A fluid-conducting connection (5) conducts liquid coolant (6) from a pump (7) to a cooler (8) over the first heat-dissipating part (3). One shut-off unit (9', 9) each is arranged in the fluid-conducting connection (5) at least between the first heat-dissipating part (3) and the cooler (8) and between the pump (7) and the first heat-dissipating part (3). To avoid an overpressure in at least one part (3, 14) to be cooled, at least one pressure-limiting valve (17, 28) is provided. The pressure-limiting valve is arranged in connection with the fluid conductor inside the part (3, 14) and/or, as part of a unit (15) for preloading the cooling liquid (6) in the fluid-conducting connection (5) and is connected to the part (3, 14) of the pressure side of a check valve (13) provided downstream of the part (3, 14).

22 Claims, 2 Drawing Sheets

(56) References Cited

U.S. PATENT DOCUMENTS

| | | | |
|---|---|---|---|
| 5,855,119 A * | 1/1999 | Pfister et al. | 62/259.2 |
| 5,873,258 A * | 2/1999 | Pfister et al. | 62/331 |
| 5,992,168 A * | 11/1999 | Pfister et al. | 62/259.2 |
| 6,038,878 A * | 3/2000 | Pfister et al. | 62/259.2 |
| 6,116,039 A * | 9/2000 | Pfister et al. | 62/259.2 |
| 6,349,553 B1 * | 2/2002 | Pfister et al. | 62/259.2 |
| 6,603,662 B1 * | 8/2003 | Ganrot | 361/698 |
| 7,055,341 B2 * | 6/2006 | Nori et al. | 62/259.2 |
| 7,165,412 B1 * | 1/2007 | Bean, Jr. | 62/259.2 |
| 7,168,251 B1 | 1/2007 | Janssen | |
| 7,299,647 B2 * | 11/2007 | Tilton et al. | 62/259.2 |
| 2003/0142479 A1 * | 7/2003 | Ganrot | 361/719 |
| 2003/0205054 A1 * | 11/2003 | Nori et al. | 62/259.4 |
| 2004/0159523 A1 * | 8/2004 | Duan et al. | 192/85 CA |
| 2005/0047083 A1 * | 3/2005 | Kondo et al. | 361/689 |
| 2005/0068724 A1 * | 3/2005 | Pokharna et al. | 361/687 |
| 2005/0259397 A1 * | 11/2005 | Bash et al. | 361/699 |
| 2006/0023424 A1 * | 2/2006 | Nakamura et al. | 361/699 |
| 2006/0032626 A1 * | 2/2006 | Keen | 165/280 |
| 2006/0249279 A1 * | 11/2006 | Chordia et al. | 165/80.4 |
| 2007/0058340 A1 * | 3/2007 | Ouyang | 361/689 |
| 2008/0123297 A1 * | 5/2008 | Tilton et al. | 361/700 |
| 2008/0186679 A1 * | 8/2008 | Matsushima et al. | 361/700 |

FOREIGN PATENT DOCUMENTS

| | | |
|---|---|---|
| EP | 0454123 | 10/1991 |
| FR | 2705523 | 11/1994 |
| WO | 2009056156 | 5/2009 |

\* cited by examiner

COOLING DEVICE

FIELD OF THE INVENTION

The invention relates to a cooling device for an electric power supply comprising at least one first heat-dissipating part whose power components are connected to the cooling device in a thermally conductive manner. A fluid-carrying connection conveys liquid coolant from a pump via the first heat-dissipating part to a cooler. One shutoff device at a time in the fluid-carrying connection of the cooling device at least is between the first heat-dissipating part and the cooler and between the pump and the first heat-dissipating part.

BACKGROUND OF THE INVENTION

Such a cooling device is disclosed in DE 2 135 677 A. The prior art cooling device is part of a transformer-rectifier device whose rectifier units are oil-cooled. The rectifier units are accommodated in separate rectifier housings, with the coolant or cooling oil being pumped by a pump through a pipeline and then in parallel through the rectifier units. After passing through and after cooling of the rectifier units, the heated coolant or cooling oil is returned to a cooler from where the coolant or cooling oil travels again to the pump. Near the inlet and outlet of each rectifier housing, valves enable a separation of the individual housings from the pipeline.

Components of power electronics that require cooling are often used in the field of drive technology and electrical energy production. Thus, the use of converter modules in the drive technology of vehicles, such as, for example, streetcars, hybrid busses, or trolley busses, that convert DC voltage into AC voltage and vice versa, is known.

In systems for producing electrical energy, such as in wind power plants, these converters are located in a housing module for electrical equipment. This housing module combines all feed lines of a generator up to a grid feed point. In addition, a transformer, a converter, and a cooling device can be combined as a unit in the housing. Such converters or rectifiers have a power transmission of several 1000 kW. Within a base body, at least two modules preferably can comprise fast-switching power semiconductors, for example, IGBTs, and can be made as prefabricated branch pair modules, such as a branch pair valve set. The heat formed as a result of conversion losses is dissipated to one or more cooling elements. Cooling liquid, often made as a water-glycol mixture for reasons of protecting against corrosion and freezing, flows through and around the cooling elements. Typically, a cooling liquid temperature of less than 70 degrees Celsius for the coolant entry should be maintained.

If work is to be performed on parts of this power electronic system for maintenance purposes, large amounts of cooling liquid may have to be removed from the cooling device. In particular, under constricted space conditions in systems such as the nacelle of a wind turbine, it is often hardly possible to set up suitable collection tanks for receiving the cooling liquid. Moreover, the complete removal of the cooling liquid from these systems is time-consuming.

SUMMARY OF THE INVENTION

An object of the invention is to provide an improved cooling device for the parts to be cooled that enables simple replacement of the parts to be cooled.

This object is basically achieved by a cooling device having, to prevent an overpressure in at least one part to be cooled, at least one pressure-limiting valve. In connection with the fluid duct, the pressure-limiting valve is located within the component and/or is part of a device for preloading the cooling liquid in the fluid-carrying connection. The pressure-limiting valve can be connected to the component via the pressure side of a check valve provided downstream of the component. This connection precludes damage to the component, such as a converter, if during operation of the device the two cocks should be inadvertently closed. An overpressure and bursting would be possible due to the temperature rise within the component. In a first alternative, a pressure-limiting valve in connection with the fluid duct is within the component. In a second alternative, an overpressure that may have built up in the component is relieved via the fluid-carrying connections toward the intake side of the pump. The pump pressure side in turn is connected to a pressure-limiting valve for setting the system pressure.

If shutting-off of the fluid-carrying connection is enabled upstream and downstream of the cooling device for purposes of evacuating the coolant, in maintenance work only the relatively small volume of coolant need be drained from the region of the component to he maintained and need be removed from the cooling device. This ability reduces the time required for this draining process as well as the amount of space required for possible collection tanks of cooling liquid. A valve in the fluid-carrying connection between the two shutoff devices in the cooling device around the first heat-dissipating part enables the drainage of cooling liquid before repair of or maintenance on the heat-dissipating part of the electric power supply.

Preferably, for each further heat-dissipating part of the electric power supply upstream and downstream on its cooling device and especially on the fluid-carrying connection of the pump and cooler provided for this purpose, a shutoff device with the indicated function and action can be included. A pertinent shutoff device can advantageously be arranged upstream and downstream of a node point in the fluid-carrying connection for coolants.

The shutoff device can be a valve of any form with a possible shutoff operating position, preferably in a seated valve design. Advantageously, a shutoff valve of simple structure can be used, for example, in the form of a cock for manual actuation. The operating position of the cock can be visually recognized from the outside in an economical design of the cooling device.

An automatic cutting-off of the fluid-carrying connection upstream and downstream of the heat-dissipating part of the power electronics of an electric power supply arises in the use of a check valve or a pilot-operated check valve. The pilot-operated check valve is opened in the flow direction of the coolant flow downstream away from the heat-dissipating part and upstream toward the heat-dissipating part at a coolant pressure that is slightly above the atmospheric pressure. If the pump for coolant is turned off during a maintenance phase of the electric power supply and a pressure drop in the fluid-carrying connection is set to a boundary pressure, the check valve closes automatically upstream and downstream of the heat-dissipating part.

After the pump has been turned off, the pressure in the cooling device can, for example, he lowered by coolant being drained on an equalizing vessel for the cooling device.

Especially preferred, the cooling device according to the invention can have all heat-dissipating parts located downstream of the high pressure side of the pump. In this way, before and after each heat-dissipating part, shutoff devices can be inserted into the fluid-carrying connection for coolant for the components. In a possible maintenance or repair, each heat-dissipating part can be decoupled separately from the coolant circuit so that only the volume of coolant of the pertinent system component need be drained. This arrangement facilitates a restart of the system and prevents the risk of feeding air bubble or gas bubble inclusions into the coolant liquid. These air bubbles could lead to "pulsation" of the pump and/or to cavitation phenomena in a restart.

At least one heat-dissipating part in a converter is preferably supported on a cooling element. In an electrical rectifier, electrical energy is converted into direct current in a 3-phase diode bridge circuit, as is generally recognized. Accordingly, a capacitor is used as a smoothing element for smoothing of the direct current. Then the electric current is transformed back by a frequency conversion in an inverter circuit with a transistor module and an IGBT module.

In the electrical converter, a conversion loss arises in the diode bridge, in the transistor module, and in the IGBT module, as well as in the reconversion elements, with heat being produced. The heat formed is dissipated to a cooling element. To obtain a more or less constant operating pressure, preferably a device is provided for preloading of the cooling liquid or of the liquid coolant in the cooling device. An accumulator designed as a diaphragm accumulator, piston accumulator, or gas accumulator is used for this purpose. The liquid pressure in the accumulator is set by a pressure valve and is limited in this way. The cooling device according to the invention is especially suitable for wind power plants whose equipment and engine room on a mast make available limited space for maintenance personnel, tools, and devices or implements. Often, in the maintenance of components of these systems, only a few liters of cooling liquid need be drained after the shutoff devices have been closed upstream and downstream of the corresponding component or the heat-dissipating part.

BRIEF DESCRIPTION OF THE DRAWINGS

Referring to the drawings which form a part of this disclosure.

DETAILED DESCRIPTION OF THE INVENTION

Figure 1:
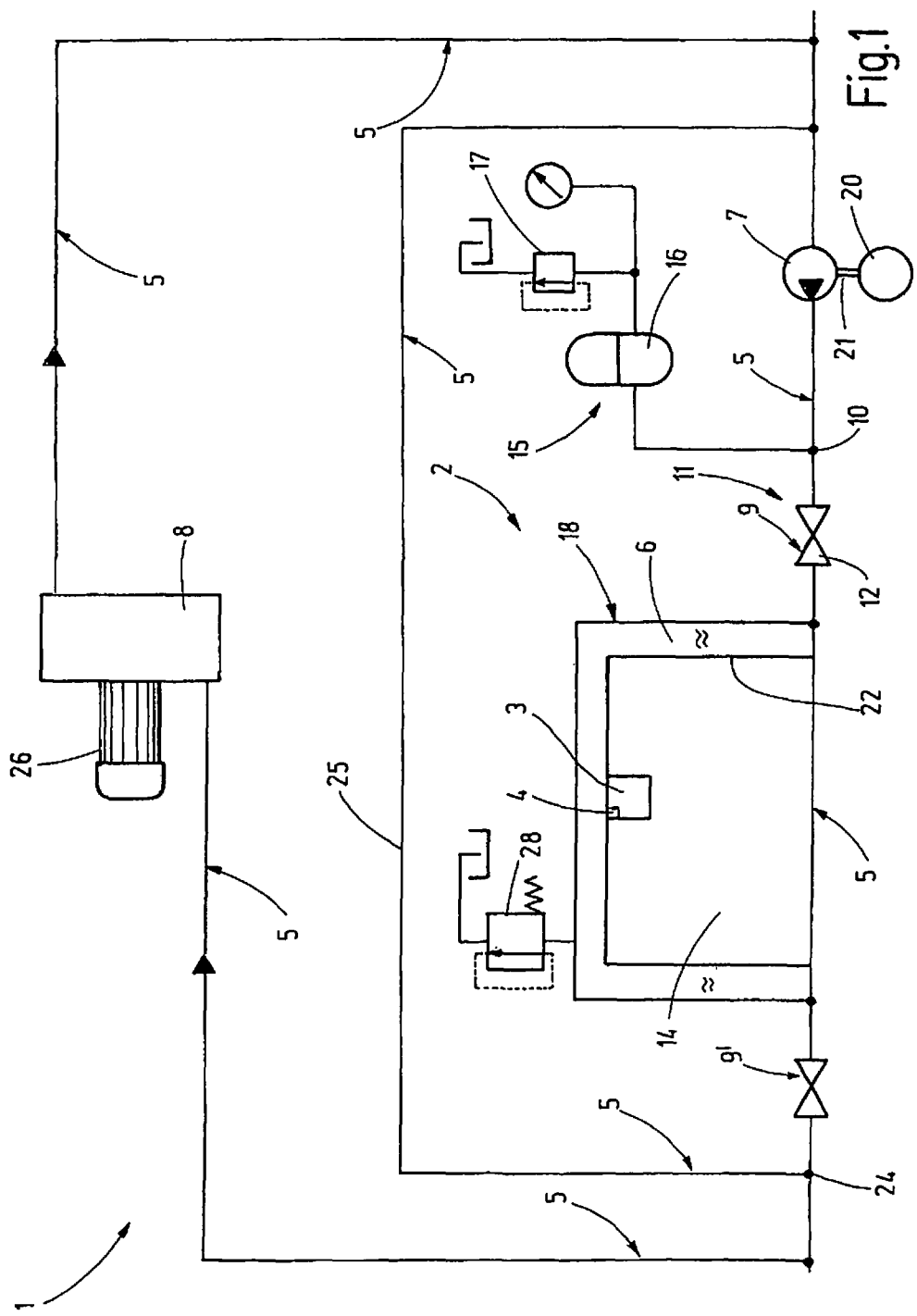
FIG. 1 is a schematic circuit diagram of a first exemplary embodiment of the cooling device according to the invention.

FIG. 1 schematically shows in a schematic circuit diagram a cooling device 1 for an electric power supply 2 of a wind power plant with its essential components. The cooling device 1 is used to cool power components, such as a capacitor module with a filter and snubber capacitor and a semiconductor module of a converter 14. The converter 14 has a housing 18 with cooling plates 4 on which heat-dissipating parts 3 that are subject to loss are mounted. The cooling plates 4 are flushed by liquid coolant 6 that is preferably a water-glycol mixture. The operating temperature of the heat-dissipating parts 3 in the converter 14 is thus kept at temperatures at which self-destruction of the semiconductor elements is avoided.

The cooling device 1 has fluid-carrying connections 5 from a pump 7 to a cooler 8 in the form of tubes or hoses. The pump 7 is preferably made as a centrifugal pump and is driven by an electric motor 20 via a drive shaft 21. The pump 7 is furthermore designed preferably for a correspondingly large volumetric flow. The operating pressure of the cooling device 1 should be, for example, about 4 bar. In the fluid-carrying connection 5 downstream of the pump 7 at a nodal point 10, there is a connection to an accumulator 16 that forms a device 15 for preloading of the coolant 6 in the entire line network and for preloading for the connected cooling plates 4. A pressure valve 17 is provided for setting the accumulator pressure.

Downstream of the nodal point 10, there is a first shutoff device 9. The shutoff device 9 is made as cock 12. The cock 12 can be manually actuated and is preferably made as a ball valve. Downstream of the cock 12 is the converter 14 with cooling plates 4. This arrangement enables the heat of the parts 3 to be dissipated to the cooling medium that is flowing through the cooling plates 4. Downstream of the housing 18 of the converter 14, the fluid-carrying connection 5 is conveyed onward and has a second shutoff device 9'. FIG. 1 shows the second shutoff device 9' as a manually actuated ball valve. In the exemplary embodiment shown in FIG. 2, instead of the ball cock, a shutoff valve 11 is made as check valve 13. The check valve 13 blocks against a flow in the direction to the converter 14, but can be opened for a flow out of the converter 14 in a pressure-actuated manner.

The shutoff devices 9, 9' enable a decoupling of the converter 14 from the remaining cooling system. A draining of coolant 6 from the cooling plates 4 of the converter 14, as described above, is easily enabled specifically in this way to expose the components of the converter 14 for maintenance purposes.

A nodal point 24 of a bypass line 25, enabling a coolant flow past a cooler 8 back to the pump 7, is mounted downstream of the second shutoff device 9'. The cooler 8, via which the coolant circulation normally takes place back to the pump 7, has a cooling fan driven by a motor 26 and dimensioned such that it recools the coolant to a temperature that is suitable to make available sufficient heat storage capacity of the coolant for the heat-dissipating parts 3.

Figure 2:
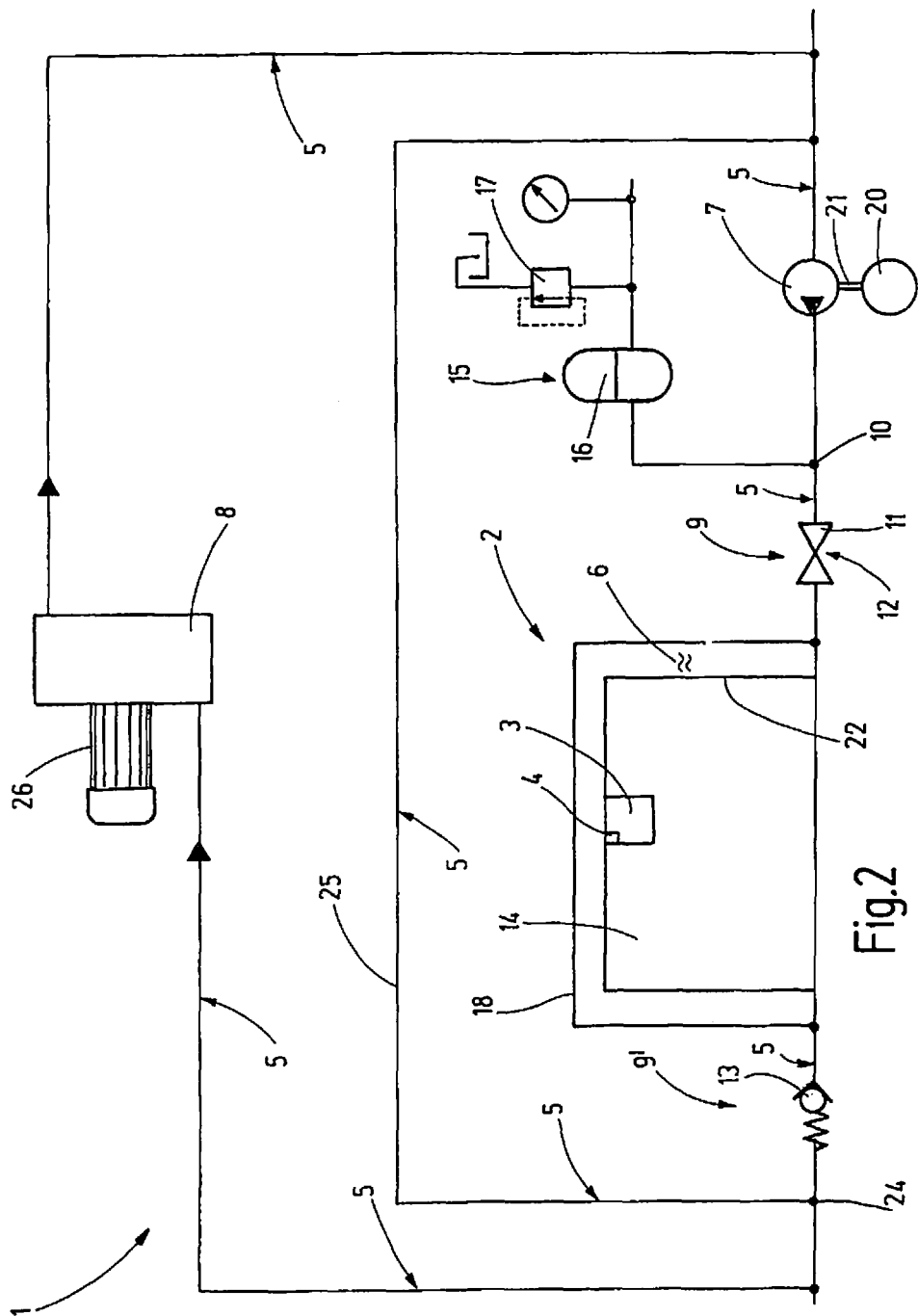
FIG. 2 is a circuit diagram of a second exemplary embodiment of the cooling device according to the invention.

FIGS. 1 and 2 show only one exemplary application of the cooling device, in particular the incorporation of a heat-dissipating part 3 between the shutoff devices 9, 9'. Further heat-dissipating parts (not shown) can be similarly incorporated between the indicated shutoff devices 9, 9' in the manner of a series connection.

As stated, in the example of FIG. 1, the shutoff devices 9, 9' are designed as cutoff valves, for example, ball valves 12, upstream and downstream of the converter 14. To preclude damage of the converter 14, if both cocks were to be inadvertently closed during operation of the device, and an overpressure and bursting that would be possible due to the temperature rise within the converter 14, in the example from FIG. 1, a pressure-limiting valve 28 is connected with the fluid duct 22 within the converter 14. As is apparent in the exemplary embodiment from FIG. 2, no pressure-limiting valve is provided on the converter 14 because the shutoff device 9' provided downstream of the converter 14 is formed by a check valve 13. Any overpressure that may have built up in the converter 14 is relieved via the fluid-carrying connections 5, including the bypass line 25, toward the intake side of the pump 7. The pump pressure side in turn is connected to the pressure-limiting valve 17 for setting the system pressure via the nodal point 10.

What is claimed is:

1. A cooling device for an electrical power supply, comprising:
   at least one first heat-dissipating part connected to power components in a thermally conductive manner;
   a cooler;
   a fluid-carrying connection conducting liquid coolant from a pump via said at least one first heat-dissipating part to said cooler;

first and second shutoff devices in said fluid-carrying connection between said at least one first heat-dissipating part and said cooler and between said pump and said at least one first heat-dissipating part, respectively; and at least one pressure-limiting valve preventing overpressure in said at least one first heat-dissipating part to be cooled, the at least one pressure-limiting valve being located in at least one of:

a fluid duct in said at least one first heat-dissipating part; or a preloading device preloading the liquid coolant in said fluid-carrying connection with said at least one first heat-dissipating part with said first shutoff device including check valve downstream of said at least one heat-dissipating part and with a pressure side of said check valve being toward said at least one first heat-dissipating part.

2. A cooling device according to claim 1 wherein said first and second shutoff devices are downstream and upstream of said at least one first heat-dissipating part, respectively.

3. A cooling device according to claim 2 wherein when the at least one pressure-limiting valve being located in the preloading device preloading the liquid coolant in said fluid-carrying connection, said first shutoff device comprises the check valve opening in a coolant flow direction away from said at least one first heat-dissipating part at an operating pressure of coolant flow.

4. A cooling device according to claim 3 wherein said check valve of said first shutoff device comprises a pilot-operated check valve.

5. A cooling device according to claim 1 wherein at least one of said first and second shutoff devices comprises a cutoff valve.

6. A cooling device according to claim 1 wherein at least one of said first and second shutoff devices comprises an actuatable cock.

7. A cooling device according to claim 1 wherein at least one of said first and second shutoff devices comprises a ball valve.

8. A cooling device according to claim 1 wherein said at least one first heat-dissipating part and all other heat-dissipating parts connected to said fluid-carrying connection are located downstream of said pump.

9. A cooling device according to claim 1 wherein said at least one first heat-dissipating part is a component of a converter.

10. A cooling device according to claim 1 wherein said liquid coolant comprises a water-glycol mixture.

11. A cooling device according to claim 1 wherein when the at least one pressure-limiting valve being located in a fluid duct in said at least one first heat-dissipating part, a preloading device preloading the liquid coolant is in said fluid-carrying connection.

12. A cooling device according to claim 11 wherein said preloading device comprises an accumulator.

13. A cooling device according to claim 1 wherein the cooling device is part of a wind power plant.

14. A cooling device for an electrical power supply, comprising:

at least one first heat-dissipating part connected to power components in a thermally conductive manner;

a cooler;

a fluid-carrying connection conducting liquid coolant from a pump via said at least one first heat-dissipating part to said cooler;

first and second shutoff devices in said fluid-carrying connection between said at least one first heat-dissipating part and said cooler and between said pump and said at least one first heat-dissipating part, respectively; and at least one pressure-limiting valve preventing overpressure in said at least one first heat-dissipating part to be cooled, the at least one pressure-limiting valve being located in a fluid duct in said at least one first heat-dissipating part.

15. A cooling device according to claim 14 wherein said first and second shutoff devices are downstream and upstream of said at least one first heat-dissipating part, respectively.

16. A cooling device according to claim 14 wherein said at least one first heat-dissipating part and all other heat-dissipating parts connected to said fluid-carrying connection are located downstream of said pump.

17. A cooling device according to claim 14 wherein a preloading device preloading the liquid coolant is in said fluid-carrying connection.

18. A cooling device according to claim 17 wherein said preloading device comprises an accumulator.

19. A cooling device for an electrical power supply, comprising:

at least one first heat-dissipating part connected to power components in a thermally conductive manner;

a cooler;

a fluid-carrying connection conducting liquid coolant from a pump via said at least one first heat-dissipating part to said cooler;

first and second shutoff devices in said fluid-carrying connection between said at least one first heat-dissipating part and said cooler and between said pump and said at least one first heat dissipating part, respectively; and at least one pressure-limiting valve preventing overpressure in said at least one first heat-dissipating part to be cooled, the at least one pressure-limiting valve being located in a preloading device preloading the liquid coolant in said fluid-carrying connection with said first shutoff device including check valve downstream of said at least one heat-dissipating part and with a pressure side of said check valve being toward said at least one first heat-dissipating part.

20. A cooling device according to claim 19 wherein said at least one pressure-limiting valve comprises a pressure valve in said preloading device.

21. A cooling device according to claim 19 wherein said check valve opens in a coolant flow direction away from said first heat-dissipating part at an operating pressure of coolant flow.

22. A cooling device according to claim 21 wherein said check valve comprises a pilot-operated check valve.

* * * * *